United States Patent [19]

Carey et al.

[11] 4,280,097
[45] Jul. 21, 1981

[54] ISOLATED DC VOLTAGE MONITORING SYSTEM

[75] Inventors: Richard L. Carey, Cardiff; Gale W. McGuffey, San Diego, both of Calif.

[73] Assignee: The United States of America as represented by the Secretary of the Navy, Washington, D.C.

[21] Appl. No.: 167,874

[22] Filed: Jul. 14, 1980

[51] Int. Cl.³ ............................................. G01N 27/02
[52] U.S. Cl. ........................................ 324/434; 320/48
[58] Field of Search ...................... 340/636, 661, 663; 320/48; 324/96, 434

[56] References Cited

U.S. PATENT DOCUMENTS

| | | | |
|---|---|---|---|
| 3,086,170 | 4/1963 | Kemelhor et al. | 324/96 X |
| 3,346,811 | 10/1967 | Perry et al. | 324/96 |
| 3,461,384 | 8/1969 | Bayati et al. | 324/96 |
| 3,546,576 | 12/1970 | Frezzolini | 340/636 X |
| 3,786,343 | 1/1974 | Ehlers | 320/48 X |
| 3,872,457 | 3/1975 | Ray et al. | 320/48 X |
| 3,895,284 | 7/1975 | Schweizer et al. | 320/48 |
| 4,017,224 | 4/1977 | Finger | 340/636 X |
| 4,024,415 | 5/1977 | Matsuura | 340/636 X |
| 4,052,717 | 10/1977 | Arnold et al. | 320/48 X |
| 4,118,661 | 10/1978 | Siekierski et al. | 320/48 X |

FOREIGN PATENT DOCUMENTS 2824789  8/1979  Fed. Rep. of Germany ............. 324/96

Primary Examiner—John W. Caldwell, Sr.
Assistant Examiner—Daniel Myer
Attorney, Agent, or Firm—Richard S. Sciascia; Ervin F. Johnston; James O. Skarsten

[57] ABSTRACT

Apparatus for electrically isolating a DC voltage source while the voltage of the source is being measured or otherwise monitored. An electronic switch is provided for selectively coupling the apparatus to the source, and a first optical device coupled to the switch receives a control signal which directs switch operation. The first optical device electrically isolates the switch from electrical equipment which generates the control signal. A device for generating an internal voltage data signal is also coupled to the switch, the frequency of such signal varying according to the voltage of the source. A second optical device receives the internal data signal, and couples an external data signal to voltage monitoring equipment, the external data signal having a frequency which varies according to the frequency of the internal data signal, the second optical device electrically isolating the switch from the voltage monitoring equipment.

13 Claims, 5 Drawing Figures

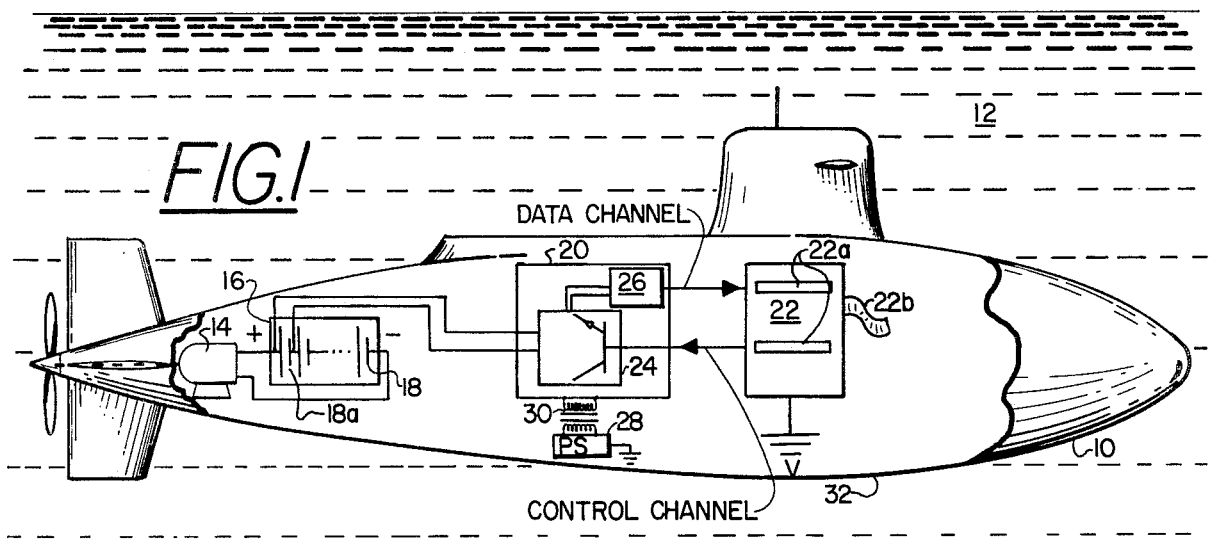
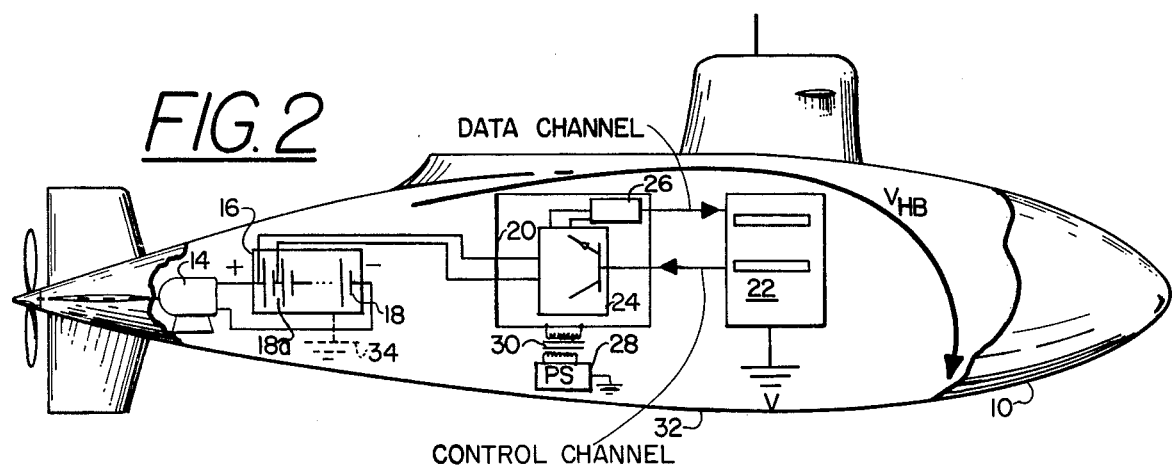
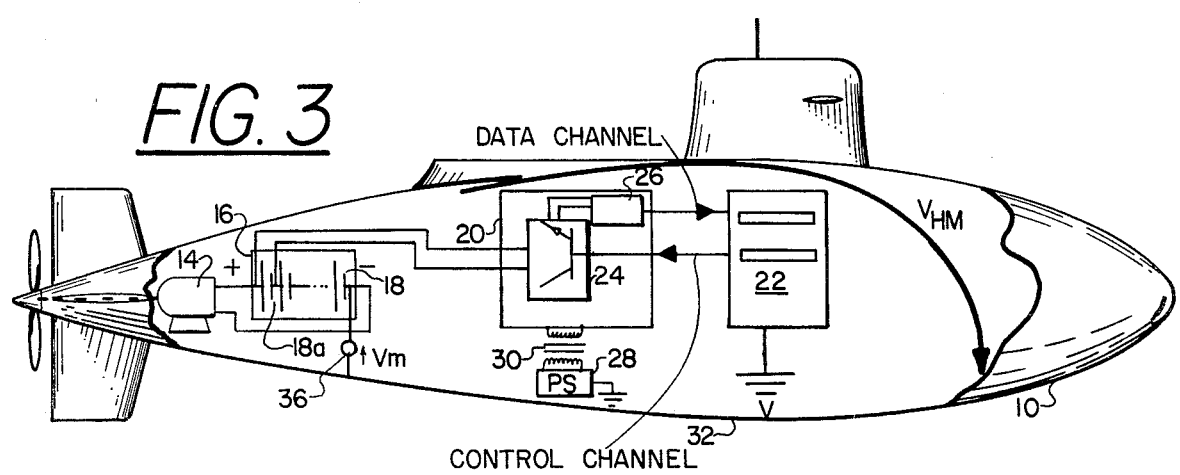

ISOLATED DC VOLTAGE MONITORING SYSTEM

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION

The invention disclosed and claimed herein pertains generally to the field of apparatus which is used to isolate a DC voltage source from a voltage measurement or monitoring system. More particularly, the invention pertains to the above apparatus wherein source voltage may be very high, and the monitoring system is to be selectively coupled to the source by means of an electronic switch. Even more particularly, the invention pertains to apparatus of the above type wherein optical-isolator devices are employed to provide high voltage barriers between a voltage measurement system and an electronic switch which is selectively coupled to the cells of a high voltage battery.

It is well known in the art that if one of the cells included in a multi-cell silver-zinc battery develops an internal short, a great deal of heat can be generated in the cell while the battery is charging or discharging. Such heat may severely damage the cell, the battery or surrounding equipment. Generally, in order to detect a shorted cell before a "hot cell" condition develops, it is necessary to periodically measure the individual voltages of every cell in the battery, and to compare such measured voltages to determine if one cell voltage is significantly less than the others. If a silver-zinc battery is very large, comprising in excess of 100 series-connected cells, the task of periodically testing individual cell voltages may be quite tedious.

In U.S. Pat. No. 3,786,343, issued to Ehlers on Jan. 15, 1974 and assigned to the U.S. Navy, the "hot cell" problem is discussed in some detail, and a system is disclosed which sequentially switches each of the cells of a silver-zinc battery to a voltage monitoring system. While the system of Ehlers has reduced some of the tedium in detecting shorted battery cells, it has also been found to have certain disadvantages. In Ehlers, mechanical relays are employed to connect respective battery cells to the monitoring system. Such relays may have oxidation on their contacts, causing errors in voltage readings. Also, each mechanical relay performs millions of connect and disconnect operations over a comparatively short period of time, whereby frequent relay replacement is required. It is also possible for a mechanical relay to stick, and to therefore remain closed, at the conclusion of a cell measurement operation. As a result, two cells can possibly become connected to the monitoring system at the same time, a situation which could be very destructive.

If a solid state electronic switching system could be used to replace the above system of mechanical relays, the various disadvantages arising from use of relays would be eliminated. However, a silver-zinc battery which includes a large number of series connected cells may have a total voltage, when fully charged, on the order of 750 volts. When the contacts of a mechanical relay are physically separated, the relay can generally withstand such high voltages. However, available electronic switches, even when in an open mode, cannot withstand voltages exceeding a limit which is on the order of 25 volts. It is therefore very important that an electronic switch connected to a high voltage battery is maintained in electrical isolation from a battery voltage monitoring system. Otherwise, high battery voltage may force a DC path through the switch to the monitoring system, severely damaging both.

In the present invention, apparatus is disclosed which successfully employs an electronic, rather than a mechanical relay, switching system to enable periodic measurement of the voltage of each of the cells of a high voltage battery. Optical means are employed to enable the switching system to receive control signals from a voltage monitoring system, and to couple voltage data thereto, while electrical isolation is maintained therebetween.

SUMMARY OF THE INVENTION

In the present invention, apparatus is provided for electrically isolating a DC voltage source while the voltage of the source is being measured or otherwise monitored, the apparatus including an electronic switching means for selectively coupling the apparatus to the source. A first optical means is coupled to the switching means and receives a control signal which directs the operation of the switching means, the first optical means comprising a means for electrically isolating the switching means from a voltage monitoring system which generates the control signal. Other means are also coupled to the switching means, for generating an internal data signal having a frequency which varies in relationship to the voltage of the source. A second optical means receives the internal data signal, and couples an external data signal to the voltage monitoring system, the external data signal having a frequency which varies in relationship to the frequency of the internal data signal. The second optical means comprises further means for electrically isolating the switching means from the voltage monitoring system.

Preferably, the first optical means comprises means for receiving an external control signal, and for generating an internal control signal in response to the external control signal, the internal control signal directing the operation of the switching means. The first optical means maintains electrical isolation between the internal and external control signals. Preferably also, the second optical means comprises means for generating an external data signal having a frequency which is equal to the frequency of the internal data signal.

In a preferred embodiment, where the voltage source is a high voltage battery conprising a large number of cells connected in series, the internal data signal generating means comprises a voltage to frequency converter. The first optical means comprises means for selectively generating different internal control signals, each of the internal control signals corresponding to one of the battery cells, and the switching means comprises an electronic multiplexing device for coupling the voltage of a given one of the cells to the voltage to frequency converter when the first optical means generates the internal control signal corresponding to the given cell. The first and second optical means in the preferred embodiment comprise optical-isolator or opto-coupling devices which are capable of withstanding very high voltages.

OBJECTS OF THE INVENTION

An important object of the present invention is to provide a system for electrically isolating a high DC voltage source while voltages of respective cells comprising the source are being measured or tested.

Another object is to employ solid state electronic switching apparatus to rapidly, controllably and reliably measure the respective voltages of each of the cells included in a high voltage multi-cell storage battery.

Another object is to provide barriers against high DC voltages in digital information channels which communicate with an electronic switching device coupled to a high voltage battery.

Another object is to employ optical isolation devices for the above barrier task.

These and other objects of the invention will become more readily apparent from the ensuing specification when taken together with the drawings.

BRIEF DESCRIPTION OF THE DRAWINGS

FIG. 1 is a block diagram having a portion broken away for showing an important application of the invention.

FIGS. 2-3 are block diagrams having portions broken away for illustrating problems which the invention is intended to overcome.

FIG. 4, comprising

DETAILED DESCRIPTION OF THE PREFERRED EMBODIMENT

Figure 4A:
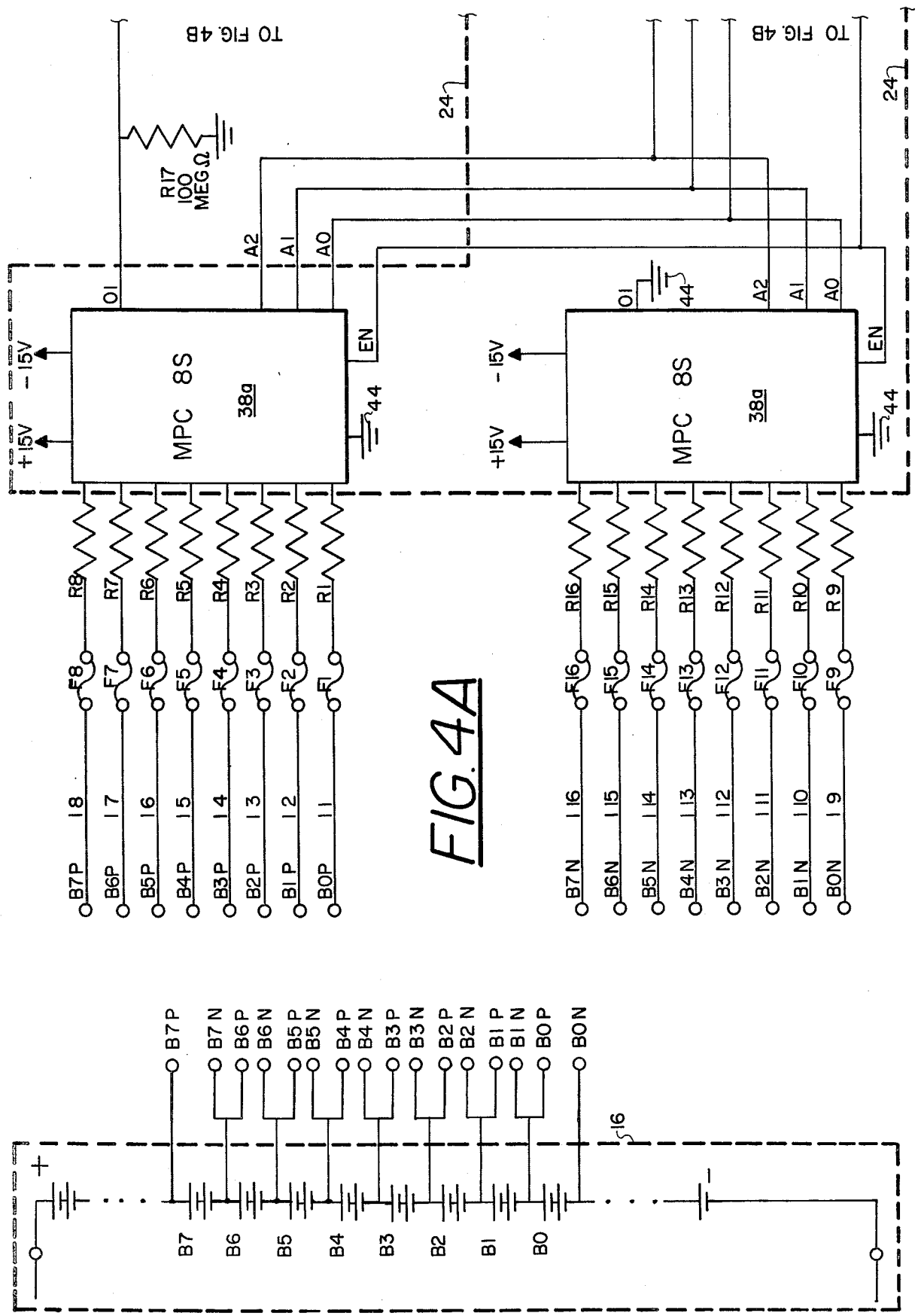
FIGS. 4A and 4B, is a schematic diagram showing an embodiment of the invention.

Referring to FIG. 1, there is shown a submarine or like submersible vessel 10 in an underwater environment 12, submarine 10 being propelled by an electric motor 14. In an arrangement which is very standard, motor 14 receives its power from a DC voltage source 16, comprising a bank or banks of storage battery cells 18. Commonly, a submarine 10 is provided with two battery banks, a starboard bank and a port bank, which can be used separately or together. If each of the banks of submarine 10 comprises 165 silver-zinc cells 18, each having a voltage on the order of two volts when fully charged, and if source 16 comprises the series interconnection of the battery banks, then the total voltage of source 16, hereinafter referred to as battery 16, could become in excess of 600 volts.

As aforementioned, it is very necessary to test the voltage of each individual cell 18 of battery 16, in order to discover internal short conditions before harm occurs therefrom. Such testing is especially important in the use of silver-zinc battery cells, which are particularly susceptible to developing such condition.

In order to select a particular cell 18a for voltage measurement, switching apparatus 20 is selectively coupled between battery 16 and a voltage monitoring system 22. Apparatus 20 includes an electronic switching device 24, which receives digital control signals from system 22 through a control channel. In response to a particular control signal corresponding to particular cell 18a, switching device 24 connects cell 18a to a device 26, also included in apparatus 20. In response, device 26 generates a digital data signal indicating the voltage of cell 18a, such data signal being coupled to system 22 through a digital data channel.

Voltage monitoring system 22 may be structured in a number of different ways, which will be readily apparent to those of skill in the art, to accomplish the following tasks: (1) generating digital control signals to operate switching device 24 to sequentially connect all of the cells 18 of battery 16 to device 26; (2) analyzing all of the digital data received from device 26; and (3) presenting the results of such analysis, i.e., the voltage conditions of respective cells 18, in a useful form, such as by displaying them on readouts 22a, or printing them on printout sheets 22b. It is anticipated that system 22 could include a portion of the digital data processing capability located aboard submarine 10. If a system 22 were to be specially designed to perform the above tasks, it is anticipated that a microprocessor could usefully be employed therein.

Referring further to FIG. 1, there is shown apparatus 20 receiving power required for the operation thereof from a power supply 28, which is coupled to apparatus 20 through a transformer 30.

If battery 16 were to be located in a building on land, the negative terminal of the battery might be connected to ground, or grounded. However, while certain electrical equipment located aboard submarine 10, including system 22, may be grounded by connection to the hull 32 of submarine 10, it is extremely important to maintain battery 16 in an isolated, or floating condition at all times, i.e., to prevent the occurrence of any electrical connection whatsoever between battery 16 and hull 32. Otherwise, a very high DC voltage potential, on the order of several hundred volts or more, could be placed across grounded electrical equipment, resulting in the damage or destruction thereof. Also, a very serious safety hazard would thereby be posed to personnel aboard submarine 10 who came in contact with hull 32.

Referring to FIG. 2, there is shown a situation which could arise if apparatus 20 was not electrically isolated, along with battery 16, from monitoring system 22. In FIG. 2, battery 16 is shown being unintentionally grounded or connected to hull 32, as the result of leakage of electrolyte. Such leakage is represented in FIG. 2 by means of grounding symbol 34. Since apparatus 20 is coupled to monitoring system 22 through the digital control and data channels, and system 22 is grounded to hull 32, a DC potential voltage $V_{HB}$ is thereby placed across apparatus 20 and system 22. If apparatus 20 is coupled to a cell at the positive end of battery 16, $V_{HB}$ may be very high, on the order of hundreds of volts. Such DC potential could cause great damage to both apparatus 20 and system 22, particularly if they comprised digital electronic components. Available digital electronic components cannot withstand DC voltages exceeding a limit which is generally on the order of 25 volts.

In order to avoid the above calamitous situation, switching device 24 is provided with an optical device, hereinafter described in greater detail. Such device is capable of passing a control signal in digital form, while preventing the passage of electric current, even when a voltage is applied thereacross which is on the order of 750 volts. A current path therefore cannot be forced through apparatus 20 and the control channel to monitoring system 22, even when battery 16 is fully charged. A similar optical device is included in device 26, to provide a high DC voltage barrier in the data channel. Apparatus 20 is thereby electrically isolated from system 22. Also, by coupling power to apparatus 20 through a transformer 30, it is not possible for a high DC voltage potential to force a current path through apparatus 20 to power supply 28. The electronic switching device of apparatus 20 may therefore be connected across any cell 18 of battery 16, and receive a voltage which is no more than 2 V.

Because of the unpredictable nature of electrolyte leakage, it is necessary to periodically measure the electrical resistance between battery 16 and hull 32. Because such resistance is generally very high, it is necessary to measure the resistance by connecting a megohmmeter between one end of battery 16 and hull 32, as shown in FIG. 3. As is well known in the art, a megohmmeter 36 must generate a voltage $V_M$, which is on the order of several hundred volts, in order to measure resistances on the order of megohms. If barriers to very high voltages were not placed in the data and control channels between apparatus 20 and system 22, a very high DC potential $V_{HM}$ could be placed thereacross.

Figure 4B:
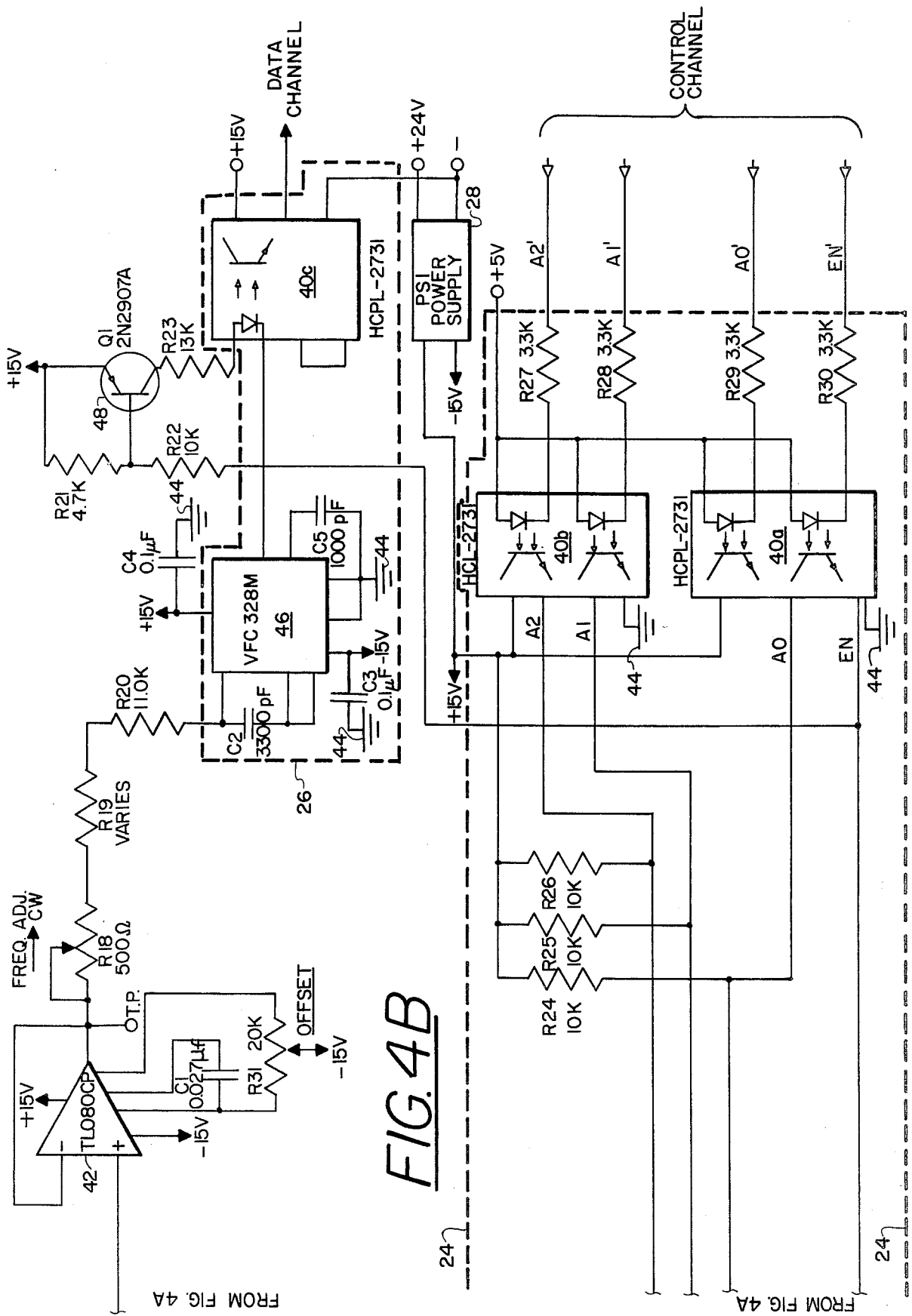

Referring to FIG. 4, there are shown eight adjacent cells of battery 16, B0-B7, a terminal being connected to the positive side of each cell, and also to the negative side thereof. The terminals connected to the positive sides of battery cells B0-B7 are respectively referenced as B0P-B7P, and the negative terminals are respectively referenced as B0N-B7N.

Referring further to FIG. 4, there is shown switching device 24 of apparatus 20 including two solid state multiplexer devices 38a and 38b. Multiplexer 38a receives input lines I1-I8, which are coupled respectively to battery terminals B0P-B7P, and multiplexer 38b receives input lines I9-I16, respectively coupled to terminals B0N-B7N. Each of the input lines includes a 1/16 Amp. fuse and a 1 KΩ. limiting resistor, such fuses and resistors being respectively designated in FIG. 4 as F1-F16 and R1-R16. Very usefully, each multiplexer 38a and 38b comprises a device manufactured by the Burr-Brown Co., and referenced thereby as a C-MOS analog multiplexer MPC8S. Such devices are capable of receiving eight different inputs, an enabling signal through an enabling line EN, and a three-bit control word through control lines A0-A2. When enabled, a multiplexer 38a or 38b responds to a particular three-bit control word by coupling a particular one of its inputs to its output line 01.

As aforementioned, switching device 24 receives a control signal from voltage monitoring system 22 through a control channel. FIG. 4 shows such control channel comprising four lines, respectively designated EN' and A0'-A2'. The EN' and A0' lines are respectively coupled to the inputs of an optical isolator device 40a, included in switching device 24, the lines A1' and A2' are coupled to the inputs of a like device 40b, also included in device 24.

Optical isolators 40a and 40b are optical devices which are capable of receiving a digital signal in an electrical form, of generating an optical signal in response thereto, and finally of providing an electrical signal in digital form which represents the original input signal. Consequently, a 4-bit control signal coupled through lines EN' and A0'-A2' may be coupled through optical isolators 40a and 40b into apparatus 20. However, the nature of optical isolator 40a and 40b is such that the application of a DC voltage thereacross, even on the order of 750 V., does not cause an electrical path to be established therethrough. Optical isolators 40a and 40b therefore have the effect of electrically isolating apparatus 20 from voltage monitoring system 22 through the control channel.

Each device 40a and 40b may be an optical isolator or optical coupling device manufactured by Hewlett-Packard Co. and designated thereby as the HCPL-2731.

Referring again to FIG. 4, there are shown outputs EN and A0 of isolator 40a, and outputs A1 and A2 of isolator 40b, respectively coupled to the control lines EN and A0-A2 of both multiplexers 38a and 38b. Consequently, a single control signal from monitoring system 22, comprising an enable signal and a three-bit control word, simultaneously operates both multiplexers. By judicious connection of respective positive terminals of cells B0-B7 to the inputs of multiplexer 38a, and of the negative terminals thereof to the inputs of multiplexer 38b, a particular control signal will cause the positive side of a particular cell to be coupled through multiplexer 38a to a buffer amplifier 42, and the negative side of the same cell to be coupled through mutliplexer 38b to apparatus ground, or common connection point, 44. The voltage of the particular cell is thereby coupled to amplifier 42, and therethrough to the input of a voltage to frequency converter 46, since the gain of buffer amplifier 42 is unity. Buffer amplifier 42 is necessary for providing a high input impedance, required by the output of multiplexer 38a, and a low output impedance, required by converter 46. It is to be noted that apparatus ground 44 is electrically isolated from all points outside of apparatus 20.

Voltage to frequency converter 46, usefully comprising a device manufactured by Burr-Brown and designated thereby as the VFC 32BM, is structured to provide a train of digital pulses having a rate or frequency which is directly related to its input voltage. Therefore, when a particular cell 18 is selected by a control signal, the output frequency of converter 46 represents the voltage of the cell.

Referring yet again to FIG. 4, there is shown device 26 including an optical isolator 40c, which is similar or identical to isolators 40a and 40b. The output of voltage to frequency converter 46 is coupled to the input of optical isolator 40c, whereby the output of isolator 40c comprises a train of digital pulses having the same frequency as the pulse train outputted by voltage frequency converter 46. The output of optical isolator 40c is coupled into the data channel, and therethrough to voltage monitoring device 22. While the respective widths of the pulses of the converter output may be different from those of the isolator output, the frequencies thereof will be equal. Consequently, the frequency of a pulse train coupled to monitoring system 22 through the data channel readily indicates the voltage of a cell 18 coupled between multiplexers 38a and b. At the same time, optical isolator 40c effectively protects system 22 against high DC voltages through the data channel.

It has been found that in a practical device employed for optical isolator 40c, a signal may be coupled thereoutof, into the data channel, even in the absence of an output from voltage frequency converter 46. An electronic switch 48 has therefore been connected to isolator 40c, such as a transistor 2N2907A, the base thereof being coupled to receive signals which enable multiplexers 38a and 38b. Switch 48 thereby allows optical isolator 40c to become activated only when the control signal coupled to apparatus 20 includes an enabling signal.

It will be readily apparent that in order for the aforementioned components of apparatus 20 to operate in the manner described, various standard resistors, capacitors and voltage sources must be selectively interconnected therewith. FIG. 4 illustrates such standard elements and their interconnections and shows values therefor which have proved to be useful in constructing an apparatus 20. All of the components shown in FIG. 4 for apparatus 20, including a practical power supply 28 manufactured by Stevens-Arnold, may be configured on a single circuit board. By providing a sufficient number of such circuit boards, each of the cells comprising battery 16 may be hard-wired, in sets of eight cells, to an apparatus 20. Once such circuit boards have been provided, and all cells 18 have been permanently connected thereto, frequent measurements of respective battery cell voltages may be made without further physical activity. To test a particular cell, it is only necessary to instruct voltage monitoring system 22 to enable the circuit board to which the particular cell is connected, and to generate a three-bit control word which selects the cell.

While the above embodiment has been found to be especially useful for periodic testing or monitoring of high voltage submarine batteries, it will be readily apparent that such embodiment, or a modification thereof, may also have numerous other applications. Generally, it is considered that the invention may have applicability wherever it is necessary to measure a DC voltage source or a DC potential voltage which is sufficiently high that it must remain separated from surrounding electrical equipment, throughout the measurement process.

Obviously, many modifications and variations of the present invention are possible in the light of the above teachings. It is therefore to be understood that within the scope of the appended claims the invention may be practiced otherwise than as specifically described.

What is claimed is:

1. Apparatus for electrically isolating a DC voltage source while the voltage of said source is being monitored, said apparatus comprising:
   electronic switching means for selectively coupling said apparatus to said source;
   first optical means coupled to said switching means and receiving a control signal which directs the operation of said switching means, said first optical means comprising means for electrically isolating said switch means from a voltage monitoring system which generates said control signal;
   means coupled to said switching means for generating an internal data signal which varies in relationship to the voltage of said source; and
   second optical means receiving said internal data signal for coupling an external data signal to said voltage monitoring system, said external data signal varying in relationship to said internal data signal, said second optical means comprising further means for electrically isolating said switching means from said voltage monitoring system.

2. The apparatus of claim 1 wherein:
   said first optical means comprises means for receiving an external control signal, and for generating an internal control signal in response to said external control signal to direct the operation of said switching means, said internal and external control signals being electrically isolated from one another;
   said means for generating said internal data signal comprises means for generating an internal data signal having a frequency which varies in relationship to the frequency of said source; and
   said second optical means comprises means for generating an external data signal having a frequency which is equal to the frequency of said internal data signal.

3. The apparatus of claim 2 wherein said voltage source comprises one of the cells of a multicell battery, and wherein:
   said means for generating said internal data signal comprises a voltage to frequency converter;
   said first optical means comprises means for selectively generating different internal control signals, each of said internal control signals corresponding to one of said cells; and
   said switching means comprises electronic multiplexing means for coupling the voltage of a given one of said cells to said voltage to frequency converter when said first optical means generates the internal control signal corresponding to said given cell.

4. The apparatus of claim 3 wherein each of said cells comprises a silver-zinc battery cell included in a battery capable of storing voltages which are in excess of 100 volts, and wherein:
   said switching means comprises first and second electronic multiplexers, each of said multiplexers having a plurality of inputs, respective positive terminals of a selected number of said battery cells comprising the inputs to a first one of said multiplexers, and respective negative terminals of said selected battery cells comprising the inputs to a second one of said multiplexer devices.

5. The apparatus of claim 4 wherein:
   said first and second multiplexers comprise means for responding simultaneously to a particular one of said internal control signals to couple the voltage of a particular one of said cells to said voltage to frequency converter.

6. The apparatus of claim 5 wherein:
   said first optical means comprises an optical isolator having an input and an output, said optical isolator being electrically unaffected when a DC potential voltage on the order of hundreds of volts is applied between its input and its output, said first optical means receiving external control signals from said voltage monitoring system through a control channel, and coupling internal control signals to said multiplexers; and
   said second optical means comprises another one of said optical isolators, said second optical means receiving internal data signals, and coupling external data signals to said voltage monitoring system through a data channel.

7. The apparatus of claim 6 wherein:
   components of said apparatus receive power required for their respective operations from a power source, said power source including a transformer for providing DC voltage isolation between said components and said power source.

8. The apparatus of claim 7 wherein:
   said first and second multiplexers, said first and second optical means and, said voltage to frequency converter comprise means which are respectively mountable on a single circuit board, the positive and negative terminals of a selected number of said battery cells being permanently wired to said circuit board, a sufficient number of said circuit boards being provided to enable each of the cells of said battery to be permanently wired to one of said circuit boards.

9. Apparatus for enabling the voltages of individual battery cells included in a battery to be tested by means of a solid state electronic voltage monitoring system, wherein said cells may have voltages on the order of one volt when said battery is fully charged, and said battery may have a total voltage on the order of hundreds of volts when fully charged, said apparatus comprising:

electronic switching means responsive to control signals received from said voltage monitoring system through a control channel;

means for receiving a DC input voltage and for coupling a data signal to said voltage monitoring system through a data channel, the frequency of said data signal representing said input voltage; and optical means placed in said control channel and in said data channel for protecting said voltage monitoring system from high DC voltages of said battery.

10. The apparatus of claim 9 wherein:

said means for coupling said data signal comprises a voltage to frequency converter means; and said switching means comprises multiplexer means responsive to said control signals for coupling the voltage of each of the cells in a selected number of said cells to said converter means in a selected sequence.

11. The apparatus of claim 10 wherein said optical means comprises:

a first optical isolator having an input coupled to said control channel to receive control signals from said voltage monitoring system, and having an output connected to said multiplexer means to couple said control signals to said multiplexer means, said first optical isolator being unaffected when a DC voltage on the order of hundreds of volts is applied between its input and its output; and a second optical isolator having an input coupled to the output of said converter means and an output coupled to said voltage monitoring system through said data channel, said second optical isolator likewise comprising means capable of withstanding a voltage on the order of hundreds of volts applied between its input and its output.

12. A method for testing individual low voltage cells included in a battery of very high voltage, said method comprising the steps of:

generating a first electronic control signal in digital form;

converting said first electronic control signal into an optical control signal in digital form;

converting said optical control signal into a second electronic control signal in digital form;

coupling said second electronic signal to an electronic multiplexer device to cause said multiplexer device to select a particular one of said cells;

generating a first train of digital pulses having a frequency which represents the voltage of said selected cell;

converting said first train of electronic pulses into a train of optical pulses; and converting said train of optical pulses into a second train of electronic pulses, said second pulse train comprising data which is coupled to said voltage monitoring system.

13. The method of claim 12 wherein:

said step of generating said first electronic control signal comprises the step of generating a control signal which includes an enable digital bit and a multi-bit control word, said enable bit selecting a voltage measurement circuit board connected to a number of said cells, and said multi-bit control word selecting a particular battery cell coupled to said selected board.

* * * * *